United States Patent [19]

Casper et al.

[11] Patent Number: 5,352,945
[45] Date of Patent: Oct. 4, 1994

[54] VOLTAGE COMPENSATING DELAY ELEMENT

[75] Inventors: Stephen L. Casper; Daniel R. Loughmiller, both of Boise, Id.

[73] Assignee: Micron Semiconductor, Inc., Boise, Id.

[21] Appl. No.: 32,900

[22] Filed: Mar. 18, 1993

[51] Int. Cl.⁵ .............................................. H03K 5/14
[52] U.S. Cl. .................................. 307/603; 307/602; 307/605
[58] Field of Search ............... 307/595, 597, 602, 603, 307/605, 606, 296.1, 296.8; 377/122; 328/66

[56] References Cited

U.S. PATENT DOCUMENTS

| | | | |
|---|---|---|---|
| 3,641,370 | 2/1972 | Heimbigner | 377/122 |
| 4,408,168 | 10/1983 | Higuchi | 307/602 |
| 4,975,605 | 12/1990 | Bazes | 307/602 |
| 4,980,586 | 12/1990 | Sullivan et al. | 307/595 |
| 5,049,767 | 9/1991 | Bennett et al. | 307/605 |
| 5,051,630 | 9/1991 | Kogan et al. | 307/595 |
| 5,111,489 | 5/1992 | Tanaka et al. | 307/595 |

*Primary Examiner*—Timothy P. Callahan
*Assistant Examiner*—My-Trang Nu Ton
*Attorney, Agent, or Firm*—Henri J. A. Charmasson

[57] ABSTRACT

A signal-delaying capacitive circuit applied to a node in a microcircuit device is immunized against the variation of the supply voltage by a metal-oxide semiconductor connected in series between the node and the signal-delaying capacitive circuit. The gate of the semiconductor is biased with a voltage signal proportional to the supply voltage, whereby the resistance of the semiconductor is increased as the supply voltage decreases; thus, isolating the capacitive circuit from the node and reducing the delay.

8 Claims, 2 Drawing Sheets

VOLTAGE COMPENSATING DELAY ELEMENT

FIELD OF THE INVENTION

The present invention relates to electronic circuits, and more specifically to circuits used to delay high-speed digital signals.

1. Background of the Invention

Most signal-delaying circuits used in various electronic devices such as in the feedback of an oscillator consists essentially of a capacitive element attached between the node where a waveform is to be delayed and ground or other reference point. This type of circuit, however, does not compensate for the fact that the speed of the device tends to increase as the supply voltage rises.

It would be advantageous to have a signal-delaying circuit which responds inversely to increases in the supply voltage in order to compensate for the above-mentioned phenomenon.

2. Summary of the Invention

The principal and secondary objects of this invention are to palliate the excessive sensibility of high-speed circuit to variations in the circuit supply voltage; and to provide an implementing circuit suitable for use in integrated microcircuits.

These and other objects are achieved by inserting a variable resistance element between a node where a waveform is to be delayed and a delaying capacitor, and biasing said variable resistance element with a voltage proportional to the power supply of the device. As the power supply voltage decreases and has the effect of slowing down signals through the device, the resistance of the variable resistance element is increased, thus masking the effect of the circuit delaying capacitor and inhibiting its delaying effect.

DESCRIPTION OF THE PREFERRED EMBODIMENT OF THE INVENTION

Figure 1:
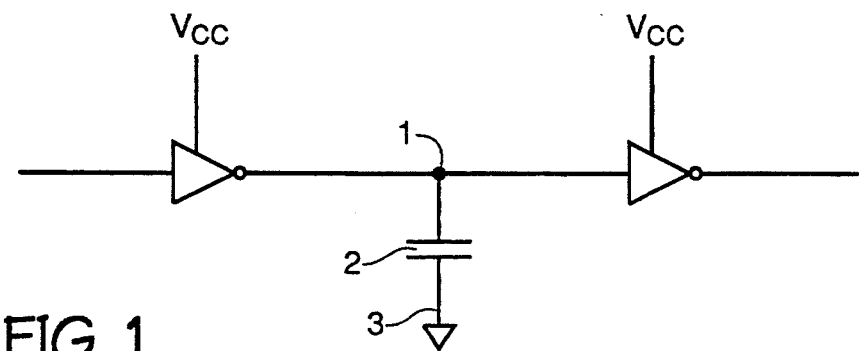
FIG. 1 is a schematic of the prior art.

As illustrated in FIG. 1, a waveform may be delayed at a certain node point 1 in an electronic circuit by inserting a capacitor 2 between the node point 1 and ground 3 or other reference point. However, this type of signal-delaying capacitor circuit does not provide any compensation for the effect of variations in the voltage supply on the speed of the circuit. It is well known that as the voltage supply increases the speed of a signal through a circuit under the voltage supply tends to increase.

Figure 2:
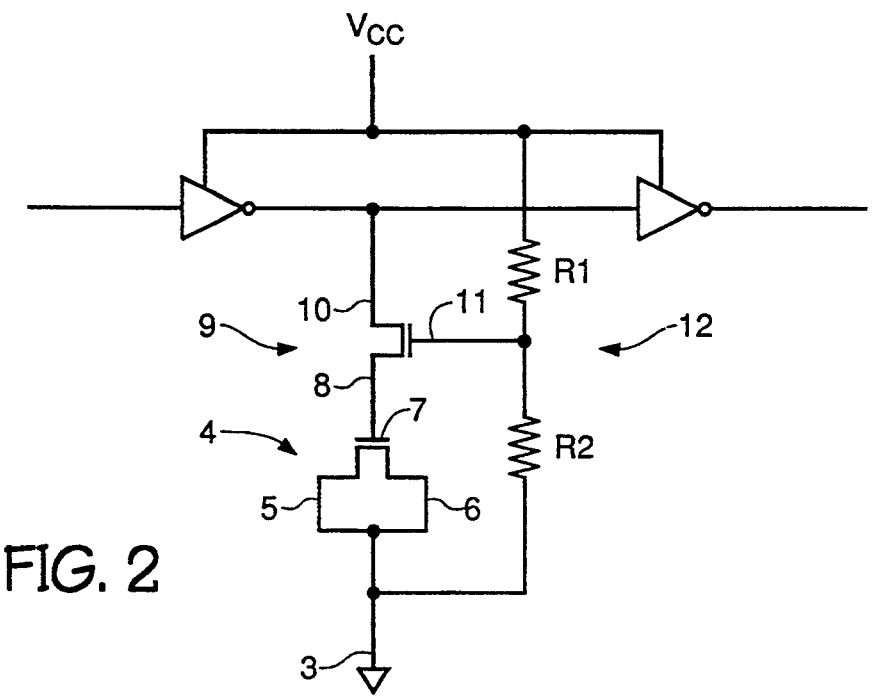
FIG. 2 is a schematic of the preferred embodiment of the invention.

FIG. 2 illustrates an improvement in the signal-delaying capacitive circuit particularly suitable for implementation in microelectronic integrated devices.

In the first place, the capacitor of the prior art 2 has been replaced by a metal-oxide semiconductor (MOS) wired to act as a capacitor. The source 5 and drain 6 of the MOS device have been wired together and connected to the reference ground 3. The gate 7 of the MOS device is connected to the source 8 of a second MOS device, the drain of which 10 is connected to the node 1 where a waveform is to be delayed. The gate 11 of the second MOS device is biased by connection to a voltage-divider circuit 12 made of resistors $R_1$ and $R_2$ between the supply voltage Vcc and the reference ground 3.

It is easy to understand that as the power supply voltage Vcc decreases and the speed of a waveform through the overall electronic device powered by said supply voltage tends to decrease as a result of said Vcc voltage drop, the biasing signal on the gate 11 of the second MOS device 9 is reduced. The source-drain resistance of this second MOS device increases. In the extreme case, where the biasing voltage derived from the voltage divider circuit 12 falls below the threshold of the second MOS device 11, the capacitive circuit created by the first MOS device 4 is totally masked and the waveform is not subject to any delay at node 1. By contrast, if the supply voltage Vcc increases the second MOS device 9 becomes more conductive and the signal-delaying capacitor circuit becomes more fully effective compensating for the general speed increase of the overall circuit resulting from the increase in the supply voltage Vcc.

It can be understood that with proper adjustment of the bias voltage of the second MOS device, the improved signal-delaying capacitive circuit can compensate for undesirable speed variation due to changes in the supply voltage.

Figure 3:
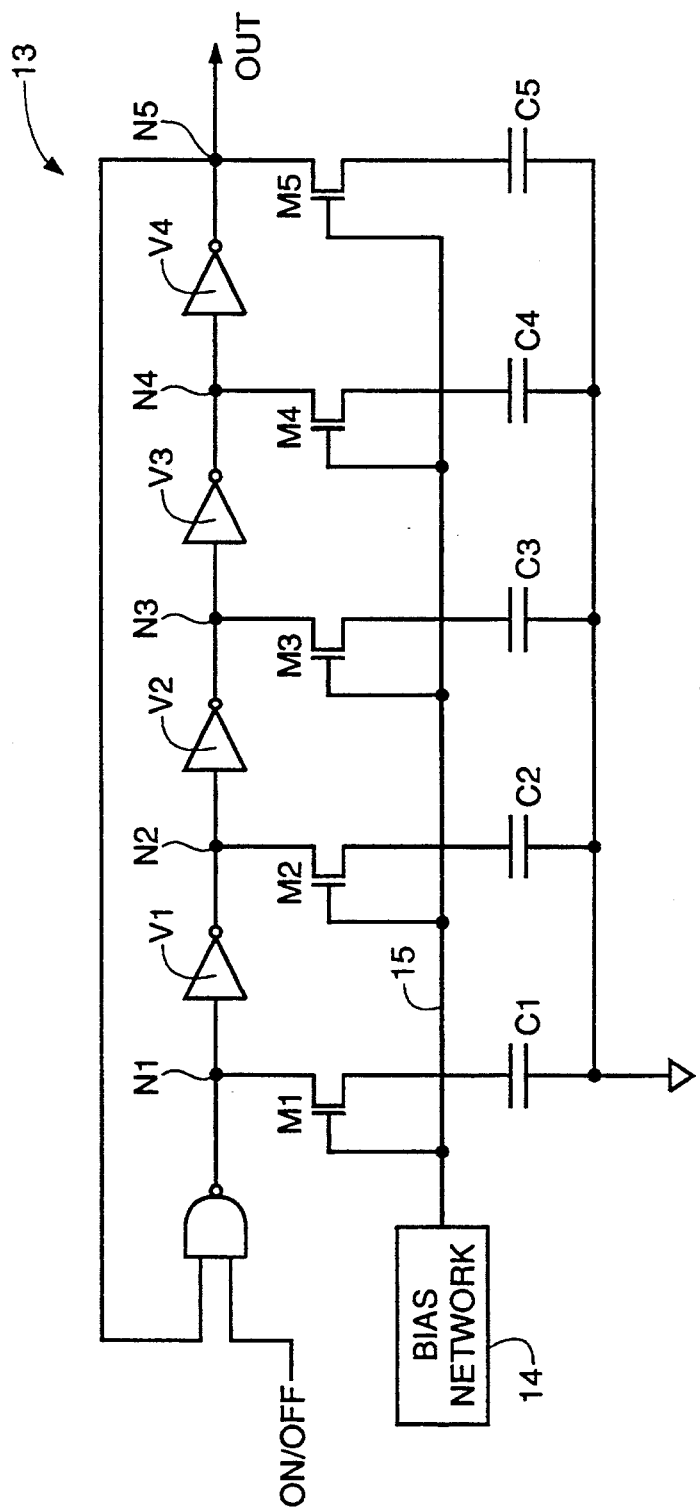
FIG. 3 is a schematic of an application of the invention to a ring oscillator circuit.

FIG. 3 illustrates the implementation of the improved signal-delaying circuit in a ring oscillator circuit 13 designed for use as part of an integrated micro-circuit device. The capacitive element is constituted by a series of polysilicon capacitors C1–C5, each in series with a MOS semiconductor M1–M5 having drains connected to a sequence of nodes N1–N5. The nodes are separated by invertors V1–V4. The gates of the semiconductors M1–M5 are connected to a bias network 14 that provides a regulating signal 15 designed to compensate for any variation of the voltage supply or of any other factor affecting the frequency of the oscillator circuit 13. The regulating signal may also be used to adjust the frequency of the oscillator circuit independently of any undesirable frequency-affecting factor. It should be understood that the capacitive elements and the variable resistance elements in each of the above-described applications may consist of various types of electronic components inherently capable of acting as such elements, as may be available now or later developed.

While the preferred embodiments of the invention have been described, modifications can be made and other embodiments may be devised without departing from the spirit of the invention and the scope of the appended claims.

What is claimed is:

1. In an electronic circuit having a signal path comprising a series of inverters biased by a supply voltage in which a delaying capacitive element is connected in a shunt path at an intermediate node along said signal path at which said signal is being delayed, said shunt path containing said capacitive element between said intermediate node and a reference point, an improvement for compensating for variations in the delaying effect of said capacitive element as a result of variations in the circuit supply voltage, said improvement comprising:

a controllable resistance element connected in said shunt path in series with said capicitive element between said intermediate node and said reference point;

said resistance element having a resistivity controllable by said bias voltage wherein said resistivity increases and said delaying effect at said node increases when said bias voltage is increased; and means for generating said bias voltage as a function of said supply voltage wherein said bias voltage is increased as the supply voltage increases.

2. The improvement of claim 1, wherein said controllable resistance element comprises a transistor having a gate connected to said bias voltage supply.

3. The improvement of claim 2, wherein said transistor is a first metal-oxide semiconductor.

4. The improvement of claim 3, wherein said capacitive element comprises a second metal-oxide semiconductor having a source and a drain connected together.

5. The improvement of claim 4, wherein said second semiconductor has a gate connected to said transistor, and said source and drain are connected together to said reference point.

6. The improvement of claim 5, wherein said first metal-oxide semiconductor has a drain connected to said node, and a source connected to a gate of said second metal-oxide semiconductor.

7. The improvement of claim 4, wherein said electronic circuit and said improvement are part of an integrated microcircuit device.

8. The improvement of claim 7, wherein said electronic circuit is a ring oscillator.

* * * * *